United States Patent [19]

Kondow et al.

[11] Patent Number: 4,794,606
[45] Date of Patent: Dec. 27, 1988

[54] OPTO-ELECTRONIC DEVICE

[75] Inventors: Masahiko Kondow, Kokubunji; Shigekazu Minagawa; Takashi Kajimura, both of Tokyo, all of Japan

[73] Assignee: Hitachi, Ltd., Tokyo, Japan

[21] Appl. No.: 172,502

[22] Filed: Mar. 24, 1988

[30] Foreign Application Priority Data

Mar. 25, 1987 [JP] Japan .................................. 62-68830

[51] Int. Cl.$^4$ ............................................... H01S 3/19
[52] U.S. Cl. .................................... 372/45; 372/39; 372/44
[58] Field of Search ............................ 372/45, 44, 39

[56] References Cited

U.S. PATENT DOCUMENTS

| | | | |
|---|---|---|---|
| 4,122,407 | 10/1978 | Van Vechten | 372/45 |
| 4,205,329 | 5/1980 | Dingle et al. | 372/45 |
| 4,644,378 | 2/1987 | Williams | 372/45 |
| 4,671,830 | 6/1987 | Burnham | 372/45 |
| 4,731,338 | 3/1988 | Ralston et al. | 372/45 |

OTHER PUBLICATIONS

Van der Ziel et al; "Absorption, Refractive Index, and Birefringence of AlAs–GaAs Monolayers", Jour. of Applied Phys. vol. 48, No. 7, Jul. 1977.

*Primary Examiner*—Léon Scott, Jr.
*Attorney, Agent, or Firm*—Antonelli, Terry & Wands

[57] ABSTRACT

An opto-electronic device has an atomic layer superlattice semiconductor comprising different semiconductor materials periodically piled up, each material having an atomic layer thickness. The superlattice semiconductor has a bandgap different from an alloy semiconductor having equivalently the same composition as the former. In a semiconductor laser, as clad layers, the atomic layer superlattice semiconductor having equivalently the same composition as a $Zn_{0.42}Cd_{0.58}S$ alloy semiconductor and a larger bandgap than the later is used, and a $ZnSe_{0.94}S_{0.06}$ alloy semiconductor as an active layer is located between the cladding layers. The double-hetero structure semiconductor laser thus provided can perform the lasing at 470 nm at room temperature.

11 Claims, 2 Drawing Sheets (A) $Al_{0.5}Ga_{0.5}As$ (B) $(AlAs)_1(GaAs)_1$ (A) Al 0.5 Ga 0.5 As (B) (AlAs)₁(GaAs)₁

● : Ga    ○ : Al

OPTO-ELECTRONIC DEVICE

BACKGROUND OF THE INVENTION

This invention relates to an opto-electronic device and more particularly to a visible light semiconductor laser having a wide lasing wavelength range.

Semiconductor lasers having a shorter lasing wavelength have been required mainly in the technical field of optical information processing. However, the AlGaAs/GaAs system which is now prevalently used can not easily provide lasing at the wavelength lower than 720 nm due to its bandgap value. Thus, the AlGaInP-/GaAs system laser has been noticed in place of the AlGaAs/GaAs system and will be put to practical use in the near future. However, this material also, due to its bandgap value, can not easily provide the lasing of yellow, green, blue, etc. at the wavelength lower than 600 nm. This AlGaInP/GaAs system is now generally considered to be a material which can provide the shortest wavelength lasing among III-V alloy semiconductor materials, as disclosed in J. Appl. Phys. Vol. 58, 1982, page 4928. This means that the semiconductor laser using the ordinary III-V alloy semiconductor material can not provide lasing at a wavelength lower than 600 nm, i.e. the lasing of yellow, green, and blue other than red.

On the other hand, development of crystal growth such as MBE (Molecular Beam Epitaxy), OMVPE (Organo Metallic Vapor Phase Epitaxy), etc. has enabled the layer thickness in an atomic layer to be controlled. FIG. 1 shows schematic diagrams of the atomic arrangement on the column III sublattice of an $Al_{0.5}Ga_{0.5}As$ alloy semiconductor and of an atomic layer superlattice semiconductor in which AlAs and GaAs are piled in each monolayer which is hereinafter referred to $(AlAs)_1(GaAs)_1$. As understood from this figure, the superlattice semiconductor having a period on the order of an atomic layer thickness is different from an alloy semiconductor having equivalently the same composition in their electronic energy structure, i.e., bandgap, since they have the same average composition but different short range orders and symmetries. For example, J. P. van der Ziel et al report in J. Appl. Phys. Vol. 48, 1977, page 3108 that in the AlGaAs/-GaAs system, the atomic layer superlattice semiconductor has a bandgap greater than the alloy semiconductor by about 100 meV. T. Nakayama et al. report the theoretical analysis of this phenomenon in J. Phys. Soc. Jpn. Vol. 54, 1985, pages 4726–4734.

SUMMARY OF THE INVENTION

FIG. 2 shows the relationship between the composition and the bandgap of the alloy semiconductor and of the atomic layer superlattice semiconductor in the AlGaAs/GaAs system, which are plotted on the basis of the data provided by J. P. van der Ziel et al. As seen from the figure, with respect to the AlGaAs/GaAs system, the implementation thereof in the atomic layer superlattice increases the bandgap but provides entirely same range of the bandgaps as the alloy semiconductor provides. For this reason, the above atomic layer superlattice does not have a merit of being applied to the device such as a semiconductor laser, and hence the phenomenon has not been so greatly noticed.

Further, the phenomenon that the superlattice semiconductor having a period on the atomic layer thickness level has a bandgap greater than the alloy semiconductor having equivalently the same composition as the former has not been demonstrated about a material other than the AlGaAs/GaAs system. This is considered because ① as mentioned above, the application thereof does not have a great merit and so the phenomenon has been unconcerned, ② the basic crystallization technique on the AlGaAs/GaAs system, which has been researched most eagerly, has been already established, ③ the AlGaAs/GaAs system, the component materials (AlAs and GaAs) of which have the bond lengths equal to each other, is much easier to grow as a crystal than the other system the component materials of which have different bond lengths and so the material having a complicated composition has not been required, etc.

On the other hand, the inventors of this invention paid their attention to the above phenomenon and investigated the material system which is applicable to an opto-electronic device, particularly a visible light semiconductor laser.

An object of this invention is to provide a semiconductor device having a superlattice structure implemented on a predetermined substrate, which has a bandgap that could not be realized using ordinary alloy semiconductors.

The superlattice structure in accordance with this invention can provide a semiconductor structure having a bandgap different from the alloy semiconductor having the same composition as the equivalent average composition over the entire superlattice structure.

The superlattice structure according to this invention is configured as follows and hereinafter referred to as an atomic layer superlattice.

The different kinds of semiconductor layers comprising from one to ten monolayers are piled up. The layer exceeding ten monolayers strongly reveals the intrinsic nature of the semiconductor materials and thus provides the effect of the pile-up of the semiconductor layers. The semiconductor is composed of at least binary compound. The typical examples thereof are III-V compound semiconductor and II-VI compound semiconductor. More concretely, the III-V compound semiconductor is InP, GaP, InA, GaAs, AlAs, AlP, etc., and the II-VI compound semiconductor is ZnSe, ZnTe, ZnS, CdTe, etc. Of course, the binary compound is most preferable in this invention. The term "monolayer" in this specification means one layer unit of the compound semiconductor of each semiconductor layers mentioned above, e.g. InP.

The equivalent bandgap of the superlattice structure according to this invention is adjusted by the selection of the average composition of the entire semiconductor structure having the superlattice structure and the number of the unit monolayers. The theoretical analysis of the above adjustment is disclosed in e.g. Journal of the Physical Society of Japan, Vol. 54, No. 12, December 1985, pp, 4726 to 4734. Incidentally, the crystal growth can be carried out through the techniques of MBE (Molecular Beam Epitaxial Method) and OMVPE (Oregano Metallic Vapor Phase Epitaxy).

Thus, the above object can be attained by a superlattice structure formed by piling up the semiconductor layers of the component materials with a very short period of 1 to 10 monolayers in each semiconductor layer. However, some materials, due to the problem of change of their transition type, do not necessarily have the greatest bandap when each semiconductor layer is provided by one monolayer, and do not have a band gap greater than an alloy semiconductor having equivalently the same composition. Otherwise, they may have the greatest bandgap when each semiconductor layer is provided by two or three monolayers.

Further, on the contrary, some superlattice materials, when the monolayers of the component materials are piled with a slightly long period of about 6 monolayers, can provide a bandgap smaller than the alloy semiconductor having the same composition as the former.

In this way, the atomic layer superlattice according to this invention can implement on a predetermined substrate the bandgap of the magnitude which the ordinary alloyed semiconductor could not implement. This advantage can be applied to several opto-electronic devices such as a semiconductor laser, a light emitting diode, a light receiving device, a composite device thereof, etc.

In the case where this invention is applied to the semiconductor laser, the atomic layer superlattice may be used as either an active layer or a clad layer. The use thereof as the active layer enables the lasing at the wavelength which could not be realized by the semiconductor laser constructed by only the ordinary alloy semiconductor. Also, the use thereof as the clad layer permits the difference in a bandgap between the active layer and the clad layer to be realized in accordance with the design requirement of a device.

A typical example of the application of this invention to the semiconductor laser is a double-hetero laser including an active layer made of $ZnSe_{0.94}$–$S_{0.06}$, which is in lattice-match with a GaAs substrate, and a clad layer made of $Zn_{0.42}Cd_{0.58}S$. Since the active layer $ZnSe_{0.94}S_{0.06}$ has a bandgap of 2.7 eV of a direct transition type, the lasing of blue at the wavelength of 470 nm or so can be exposed. However, since the clad layer $Zn_{0.42}Cd_{0.58}S$ has a bandgap of 2.9 eV which is very slighly different from that in the active layer, the lasing at room temperature can not be easily realized.

On the other hand, if the atomic layer superlattice, one period of which is (ZnS) (CdS) (ZnS) (CdS) (ZnS) (CdS) and (CdS) is used as the clad layer, it can be lattice-matched with the GaAs substrate since its lattice constant is equal to the $Zn_{0.42}Cd_{0.58}S$ alloy semiconductor and also it can provide an increased bandgap due to the increase of short range order. Therefore, by using as the clad layer, the above atomic layer superlattice in place of the $Zn_{0.42}Cd_{0.58}S$ alloyed semiconductor, stabilized lasing can be attained.

Accordingly, the atomic layer superlattice according to this invention can be effectively adapted to many other systems which can not provide lasing in a visible light range because the alloy semiconductor used as the clad layer has a small bandgap.

DESCRIPTION OF THE PREFERRED EMBODIMENTS

Embodiment 1

Figure 1:
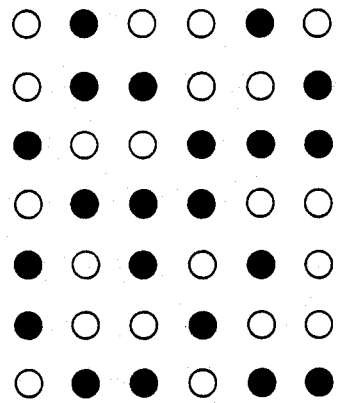
FIGS. 1(A) and 1(B) are schematic diagrams of the column III atom arrangement of an $Al_{0.5}Ga_{0.5}As$ alloy and $(AlAs)_1(GaAs)_1$ superlattice semiconductor.
Figure 1:
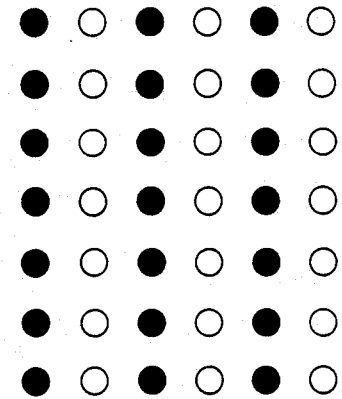
Figure 2:
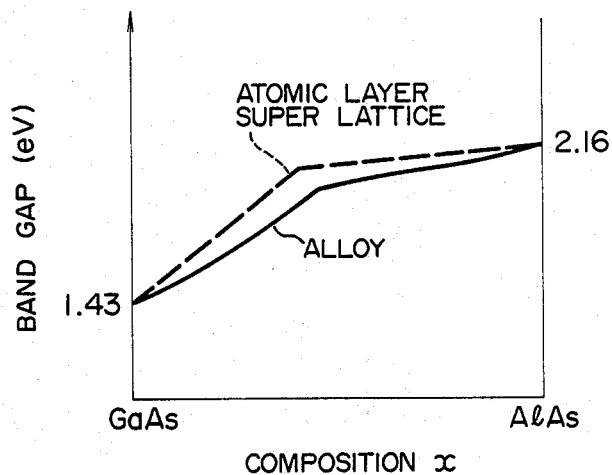
FIG. 2 is a graph showing the relationship between the composition and the bandgap of an alloy semiconductor and of an atomic layer super-lattice semiconductor in an AlGaAs/GaAs system.
Figure 3A:
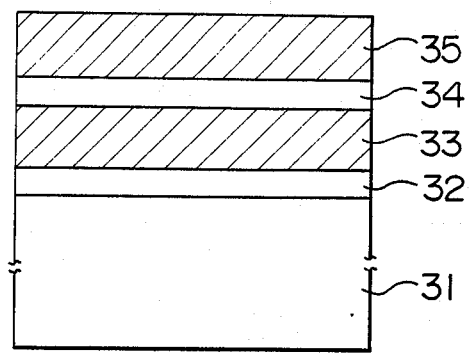
FIG. 3a is a sectional view of a semiconductor laser device according to a first embodiment of this invention.
Figure 3B:
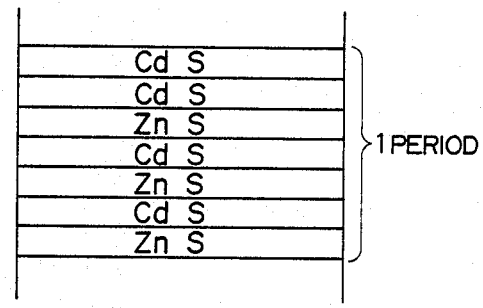
FIG. 3b is a partially enlarged sectional view of the clad layer 33 in FIG. 3b.

FIG. 3a shows a lamination structure according to this embodiment. First, an undoped GaAs buffer layer 32 having a thickness of 0.1 μm is epitaxially grown on a semi-insulating (100) GaAs substrate 31. A clad layer 33 having a thickness of 0.5 μm which is constructed by an atomic layer superlattice having periods consisting of seven monolayers of (ZnS), (CdS,), (ZnS), (CdS), (ZnS), (CdS) and (CdS). FIG. 3b schematically shows the lamination on pile-up state of the atomic layer superlattice in a cross section. A $ZnSe_{0.94}S_{0.06}$ alloy semiconductor 34 of 0.1 μm, which constitutes an active layer, is epitaxially grown on the clad layer. Finally, another clad layer 35 of 0.5 μm is epitaxially grown on the active layer 34. The respective epitaxial layers 32 to 35 are piled up in an atomic layer epitaxial growth system improved on MBE (Molecular Beam Epitaxy) device by alternately opening and closing, for each atomic layer, the shutter of a column II (or III) atom cell and the shutter of a column VI (or V) atom cell. This is carried out monitoring the intensity of RHEED. The active layer ZnSeS is formed to be an alloy semiconductor by simultaneously opening and closing the cells of Se and S. The double-hetero structure wafer thus provided is formed in a chip having a size of 300×500 (μm)² by means of cleavage. The cleavage plane constitutes the resonator end surface of the semiconductor laser. The semiconductor laser thus provided permits lasing at 470 nm at room temperature by optically pumping by a dye laser having a lasing wavelength of 400 nm. In this embodiment, the doping into the epitaxial layers is not performed since the optical pumping permits lasing. Of course, a semiconductor laser of an ordinary current injection type can be constituted. Incidentally, the pile-up state in the superlattice was recognized by a transmission electron microscope.

Embodiment 2

In this embodiment, this invention is applied to a current injection type semiconductor laser. The atomic layer superlattice is used as the clad layer of the semiconductor laser.

Figure 4:
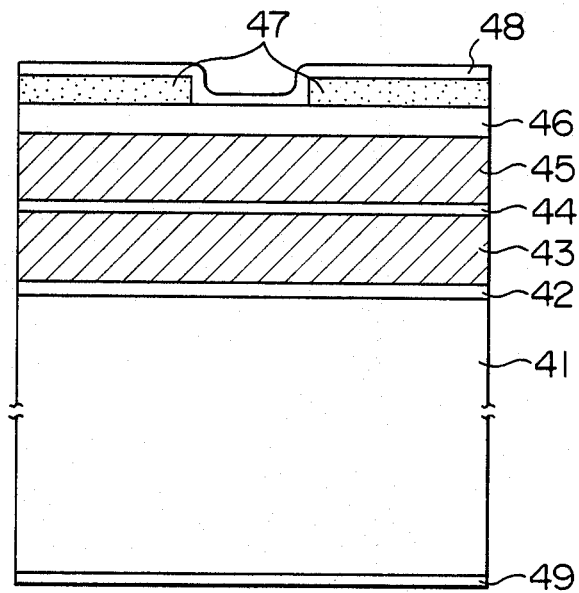
FIG. 4 is a sectional view of a semiconductor laser device according to a second embodiment of this invention.

FIG. 4 shows the sectional structure of the current injection type semiconductor laser. First, a Se-doped n-type GaAs buffer layer 42 of 0.1 μm is epitaxially grown on an n-type (100) GaAs substrate. A clad layer 43 of 1 μm which is an atomic layer superlattice formed by alternately piling up two n-type InP monolayers and two n-type AlP monolayers (these monolayers are Se-doped) is epitaxially grown on the buffer layer 42. An un-doped $Al_{0.25}Ga_{0.25}In_{0.5}P$ alloy semiconductor 44 of 0.1 μm which constitutes an active layer is epitaxially grown on the clad layer 43. Another atomic layer superlattice clad layer 45 of 1 μm which is formed by alternately piling up two p-type InP monolyaers and two p-type AlP monolayers (these monolayers are Zn-doped) is epitaxially grown on the active layer 44. Finally, a Zn-doped p-type GaAs 46 of 0.5 μm which serves as a cap layer is epitaxially grown on the clad layer 45. The respective epitaxial layers 42 to 46 were successively grown by an OMVPE (Organo Metallic Vapor Phase Epitaxy) device which can provide an abrupt hetero-interface in the atomic layer by moving a substrate within two reactors. The n-type and the p-type carrier concentration was fixed to $1 \times 10^{18}$ cm$^{-3}$. Formed on the double-hetero structure wafer thus provided are an SiO$_2$ current blocking layer 47 and ohmic-electrodes 48 and 49 to form a stripe-laser. The laser according to this embodiment could realize lasing of yellow at 580 nm at room temperature. Although the n-type substrate was used in this embodiment, a p-type substrate may be used. Strictly speaking, the (InP)$_2$(AlP)$_2$ superlattice is not in lattice-match with the GaAs substrate so that two (InP)$_2$ monolayers are successively piled one per twelve growth to accomplish a complete lattice match. This idea can be also applied to Embodiment 1. Further, although Al$_{0.25}$Ga$_{0.25}$In$_{0.5}$P was used as the active layer in this embodiment, (Al$_x$Ga$_{1-x}$)$_{0.5}$In$_{0.5}$P($0 \leq X \leq 0.7$), which is in lattice-match with the GaAs substrate may be used.

Table 1 shows examples of the semiconductor laser which can be fabricated in the manner like this embodiment. As apparent from the Table, lasing of yellow, green, yellow green, etc. which could not implemented by the prior art can be realized.

TABLE 1

| Substrate | Active layer (0.1 μm) | Clad layer (1 μm) | Lasing wave length | Color |
|---|---|---|---|---|
| GaAs | (InP)$_1$(GaP)$_1$ superlattice | In$_{0.5}$Al$_{0.5}$P alloy | 630 nm | Red |
| GaAs | Superlattice with one period consisting of (InP)$_1$(GaP)$_1$ (InP)$_1$(AlP)$_1$(InP)$_1$(AlP)$_1$ | ZnSe | 530 nm | Green |
| InP | ZnTe$_{0.5}$Se$_{0.5}$ | (ZnTe)$_1$(ZnSe)$_1$ superlattice | 580 nm | yellow |
| InP | (ZnTe)$_3$(ZnSe)$_3$ superlattice | (ZnTe)$_1$(ZnSe)$_1$ superlattice | 550 nm | Yellow green |

In accordance with this invention, the superlattice semiconductor formed by periodically piling up different semiconductor materials each with an atomic layer thickness level can provide a bandgap different from the alloy semiconductor having equivalently the same composition as the former, thereby implementing a device such as a visible light semiconductor laser which could not be realized using the ordinary alloy semiconductor.

What is claimed is:

1. An opto-electronic device having a superlattice semiconductor comprising different semiconductor material layers periodically piled up, each layer having a thickness of 1 to 10 monolayers, said superlattice semiconductor having equivalently the same composition as said superlattice semiconductor.

2. An opto-electronic device according to claim 1, wherein said superlattice semiconductor having a bandgap larger than the alloy semiconductor having equivalently the same composition as said superlattice semiconductor.

3. An opto-electronic device according to claim 1, wherein said superlattice semiconductor is constituted by piling up layers of different II-VI binary semiconductors.

4. An opto-electronic device according to claim 1, wherein said superlattice semiconductor is one selected from the group consisting of a ZnCdS system, ZnTeSe system and AlGaInP system.

5. An opto-electronic device according to claim 1, wherein said opto-electronic device is a double-hetero structure semiconductor laser, and said superlattice semiconductor is a clad layer.

6. An opto-electronic device according to claim 5, wherein said double-hetero structure semiconductor laser comprises a first conduction type GaAs substrate, a first conduction type GaAs buffer layer formed on said GaAs substrate, a first clad layer of said superlattice semiconductor of a first conduction type which is formed on said GaAs buffer layer, an (Al$_x$Ga$_{1-x}$)$_{0.5}$In$_{0.5}$P ($0 \leq X \leq 0.7$) active layer formed on said first clad layer and having a smaller bandgap and a larger refractive index than said first clad layer, a second clad layer of said superlattice semiconductor of a second conduction type opposite to said first conduction type, having a larger bandgap and a smaller refractive index than said active layer, which is formed on said active layer, and electrodes electrically connected with said layers of the first conduction type and the second conduction type, and the superlattice semiconductor of said first and second clad layers is formed by alternately piling up two InP monolayers and two AlP monolayers.

7. An opto-electronic device according to claim 5, wherein said superlattice semiconductor has equivalently the same composition as a Zn$_{0.42}$Cd$_{0.58}$S alloy semiconductor.

8. An opto-electronic device according to claim 7, wherein said double-hetero structure semiconductor laser comprises two cladding layers, each consisting of said superlattice semiconductor, and an active layer comprising a ZnSe$_{0.94}$S$_{0.06}$ alloy semiconductor provided between each of said cladding layers.

9. An opto-electronic device according to claim 1, wherein said opto-electronic device is a double-hetero structure semiconductor laser, said superlattice semiconductor is an active layer and the bandgap of the superlattice semiconductor is smaller than the alloy semiconductor having equivalently the same composition as said superlattice semiconductor.

10. An opto-electronic device according to claim 9, wherein said double-hetero structure semiconductor laser comprises a first conduction type GaAs substrate, a first clad layer of a first conduction type ZnSe formed on said GaAs substrate, as an active layer of said superlattice semiconductor having a smaller bandgap and a refractive index than said first clad layer, which is formed on said first clad layer, a second clad layer of a second conduction type ZnSe formed on said active layer, having a larger bandgap and a smaller refractive index than said active layer, and electrodes electrically connected with said clad layers of the first conduction type and the second conduction type, and the superlattice semiconductor of said active layer has one period consisting of InP, GaP, InP, AlP, InP, and AlP each of which corresponds to a monolayer.

11. An opto-electronic device according to claim 1, wherein each of said different semiconductor material layers is made of a stoichiometric semiconductor compound.

* * * * *

UNITED STATES PATENT AND TRADEMARK OFFICE
CERTIFICATE OF CORRECTION

PATENT NO. : 4,794,606
DATED : December 27, 1988
INVENTOR(S) : KONDOW et al

It is certified that error appears in the above-identified patent and that said Letters Patent is hereby corrected as shown below:

Column 5, line 48, (Claim 1), after "having" insert
--a bandgap different from an alloy semiconductor having--.

Signed and Sealed this

Nineteenth Day of May, 1992

Attest:

DOUGLAS B. COMER

*Attesting Officer*     *Acting Commissioner of Patents and Trademarks*